United States Patent [19]

Skonieczny et al.

[11] Patent Number: 4,566,101

[45] Date of Patent: Jan. 21, 1986

[54] OSCILLATORY FAILURE MONITOR

[75] Inventors: Joseph P. Skonieczny, Madison; Richard D. Murphy; Douglas H. Clelford, both of Trumbull, all of Conn.

[73] Assignee: United Technologies Corporation, Hartford, Conn.

[21] Appl. No.: 470,370

[22] Filed: Feb. 28, 1983

[51] Int. Cl.[4] ............................................. G06F 11/30
[52] U.S. Cl. .......................................... 371/5; 371/68; 377/16
[58] Field of Search ................. 377/16, 39; 371/5, 20, 371/57, 68

[56] References Cited

U.S. PATENT DOCUMENTS

| | | | |
|---|---|---|---|
| 4,053,751 | 10/1977 | Ault | 371/5 |
| 4,234,953 | 11/1980 | Kline | 371/5 |
| 4,263,583 | 4/1981 | Wyckoff | 377/16 |
| 4,363,123 | 12/1982 | Grover | 371/5 |
| 4,475,086 | 10/1984 | Allen | 377/39 |

Primary Examiner—John S. Heyman
Attorney, Agent, or Firm—Gerald E. Linden

[57] ABSTRACT

An oscillatory-failure monitor (101) compares a parameter of a plurality of signals (A, B) within a tolerance (TOL) to determine agreement or disparity among the signals. Each discrete miscompare occurrence (i.e., singular disparity following full agreement) is counted by incrementing (27; 54) a counter (OSCCT; CNTR). The counter is decremented (32; 62) whenever the signals compare for a predetermined time interval (29; 47). An oscillatory-failure is declared when the counter increments to a threshold (28, 21; 57, 58, 60). Both digital (FIG. 1) and dedicated hardware (FIG. 4) embodiments are disclosed.

1 Claim, 5 Drawing Figures

| | INIT | 1 | 2 | 3 | 4 | 5 | 6 | 7 | 8 | PRE LIST OUT | 9 | 10 | 17 18 | 19 | 20 | 21 | 22 | 23 | 24 | 25 | 26 | 27 | 33 | 34 | 35 | 36 | 37 | 38 |
|---|---|---|---|---|---|---|---|---|---|---|---|---|---|---|---|---|---|---|---|---|---|---|---|---|---|---|---|---|
| PASS | | | | | | | | | | →X | | | | | | | | | | | | | | | | | | |
| TEST 17 | Ⓒ | M | C | M | M | M | M | M | M | | Ⓒ | C | C C | M | C | M | C | M | C | C | C | C | C | C | C | M | M-C | M |
| MISCT | -5 | -4 | -5 | -4 | -3 | -3 | -2 | -1 | 0 | | -5 | -5 | -5 -5 | -4 | -4 | -5 | -4 | -5 | -4 | -5 | -5 | -5 | -5 | -5 | -4 | -5 | -4 | -4 |
| OSCCT | -5 | -4 | -4 | -3 | -3 | -3 | -3 | -3 | -3 | | -5 | -5 | -5 -5 | -4 | -4 | -3 | -3 | -2 | -2 | -1 | -1 | -1 | -1 | -1 | -1 | -2 | -1 | -1 |
| CMPCT | -10 | -10 | -10 | -9 | -10 | -10 | -10 | -10 | -10 | | -9 | -8 | 0/-10 | -9 | -10 | -10 | -9 | -10 | -10 | -10 | -9 | -9 | -8 | -2 | -1 | 0/-10 | -9 | -9 |

TEST 17
C = COMPARE
M = MISCOMPARE

OSCILLATORY FAILURE MONITOR

The Government has rights in this invention pursuant to Contract No. N00019-77-C-0202 awarded by the Department of the Navy.

DESCRIPTION

1. Technical Field

This invention relates to detecting differences between a plurality of signals and more particularly to detecting oscillatory differences therein.

2. Background Art

Many control systems operate in response to a plurality of signals. For example, an aircraft automatic flight control system (AFCS) responds to the outputs of gyros, altimeters, accelerometers, computers, actuators, etc. in order to control the maneuvering of the aircraft. Hereinafter, signals provided by sensors are discussed, but the teachings are applicable to other signals.

A redundant sensor system uses two or more sensors to provide signals indicative of a single physical condition. In order to determine a sensor failure, the sensor signals may be compared, to determine agreement or disparity among the signals, within a tolerance. The sensor signals "compare" when the signals are all in agreement and "miscompare" when at least a single disparity exists. To avoid declaring a sensor failure based on transient sensor output miscompares, it is known to sample the sensor outputs to determine if a miscompare has lasted for a confirmed-failure time interval. Typically, this is accomplished by incrementing a counter (or starting a timer) when the sensor outputs miscompare and resetting the counter (or timer) whenever the sensor outputs compare. This sustained-miscompare technique may be performed with hardware continuously, or with a digital computer, cyclicly (i.e., by counting passes). While this provides satisfactory performance for the majority of anticipated sensor failure modes (i.e., hardover or go-dead), high frequency oscillatory failures which oscillate from miscompare to compare before the confirmed-failure time interval has elapsed are not detectable by the sustained-miscompare technique. Since high frequency oscillatory failures are undetected, they are passed by the AFCS and manifested to the pilot as aircraft oscillations. Due to the closed loop operation of the AFCS, it is very difficult to isolate the source (i.e., airframe or AFCS) of such oscillations, often causing the pilot to disengage the AFCS in order to isolate the source. This greatly increases the workload and may possibly result in a mission abort. Or, if the problem is in the airframe, switching off the AFCS may actually aggravate the problem (i.e., the beneficial effects of the AFCS will be lost).

DISCLOSURE OF INVENTION

Therefore, the main object of this invention is to detect and to indicate oscillatory failures, in a plurality of signals, and more particularly to isolate the cause of aircraft oscillations.

According to the present invention, an oscillatory-failure is determined by comparing a plurality of signals, such as the outputs of redundant sensors. When the signals vary from "compare" (all agree) to "miscompare" (at least one disparity), a counter is incremented. When the counter is incremented to a threshold, an oscillatory-failure is indicated. In order to determine that a sustained oscillation has been detected, the counter is decremented (but not below its initial value) when the redundant sensor outputs "compare" for a predetermined-time interval, thus preventing unsustained oscillations or a sequence of widely separated transient "miscompares" from indicating an oscillatory-failure. The oscillatory-failure monitor is adaptable, in use, for association with a sustained-miscompare monitor that indicates a sensor failure based on "miscompares" that last for a confirmed-failure time interval.

Other objects, features and advantages of the present invention will become more apparent in the light of the following detailed description of exemplary embodiments thereof.

BEST MODE FOR CARRYING OUT THE INVENTION

Figure 1:
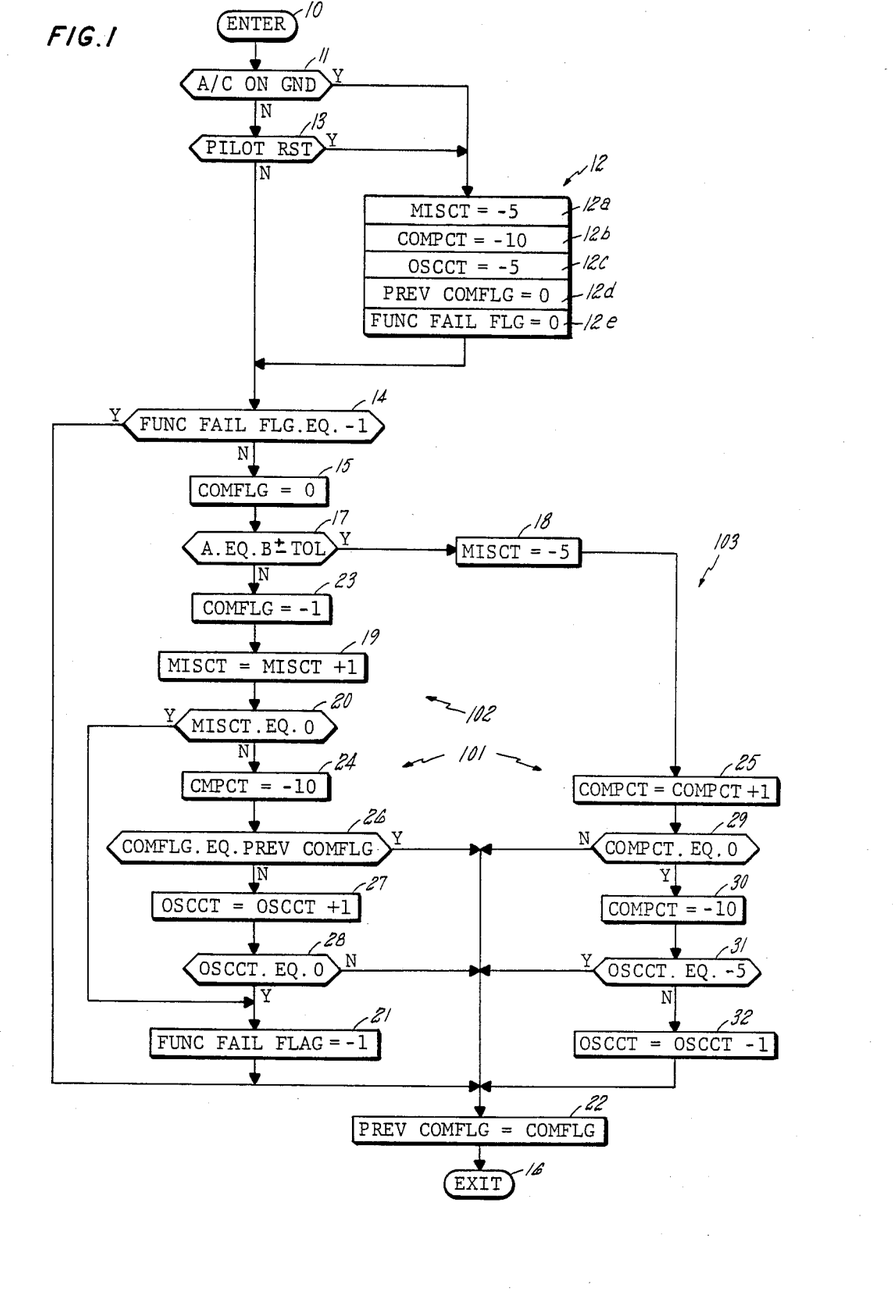
FIG. 1 is a simplified logic flow diagram of an exemplary digital embodiment of the present invention in association with a Sustained-Miscompare Monitor.

In FIG. 1, there is shown a flow chart for a routine that includes an Oscillatory-Failure Monitor 101 for an aircraft AFCS that has redundant sensors for providing two signals (A, B) indicative of a single physical condition, in association with a Sustained-Miscompare Monitor 102. The routine is accessed via an entry port 10. In a first test 11, it is determined whether the aircraft is on the ground (A/C ON GND). If so, the following counters are initialized at a series of steps 12: Miscompare Counter set to MINUS FIVE (MISCT=−5) 12a, Compare Counter set to MINUS TEN (CMPCT=−10) 12b, Oscillation Counter set to MINUS FIVE (OSCCT=−5) 12c, Previous Comparison Flag set to ZERO (PREV COMFLG=0) 12d, and Function Failure flag set to ZERO (FUNC FAIL FLG=0) 12e. Then the routine proceeds to a test 14 (discussed hereinafter). If the aircraft is not on the ground, it is determined in a test 13 (PILOT RST), whether the pilot desires to reset the monitors 101, 102 after a sensor failure is indicated (discussed hereinafter). If a reset is commanded by the pilot, the routine proceeds to the steps 12 (discussed hereinbefore) and, if not, the routine proceeds to the test 14 (discussed hereinafter). The various steps and tests 11, 12, 13 comprise an initialization process as it specifically applies to an aircraft AFCS redundant sensor system, but the Oscillatory-Failure Monitor 101 is applicable to detect oscillatory miscompares in any system wherein it is desirable to monitor a plurality of signals for agreement and disparity.

As the routine proceeds to the test 14, it is determined whether a sensor has already failed (FUNC FLG. EQ. −1). If so, the monitors 101, 102 are bypassed and the routine is exited, via a step 22 (discussed hereinafter), at an exit port 16. If a sensor has not failed, a Comparison Flag is set to ZERO, at a step 15, to indicate an initial compare condition (COMFLG=0). Then, the signals (A, B) of the redundant sensors are compared in a test 17 to determine whether they are within a tolerance (TOL) of each other (A. EQ. B±TOL). If they compare, the Miscompare Counter is reinitialized at a step 18 (MISCT=−5) and the routine proceeds through a compare branch 103 of the Oscillatory-Failure Monitor 101 (discussed hereinafter). If the signals (A,B) miscompare (at the test 17), a sensor miscompare is "flagged" by setting the value of the Comparison Flag to MINUS ONE at a step 23 (COMFLG=−1).

Based on the signal miscompare (at the test 17), the Miscompare Counter is incremented by ONE at a Step 19 (MISCT=MISCT+1). Then, in a test 20 it is determined whether the Miscompare Counter has reached its threshold (MISCT. EQ. 0). If so, the routine proceeds to a step 21 where the Function Failure Flag is set to indicate a sensor failure (FUNC FAIL FLG=−1). Then the routine is exited via the step 22 (discussed hereinafter). If the Miscompare Counter has not reached its threshold (at the step 20), the routine proceeds to a step 24 (discussed hereinafter).

The steps 12a, 18, 19, 21, and the tests 11, 13, 14, 17 and 20 comprise the Sustained-Miscompare Monitor 102 of the prior art. Although the Sustained-Miscompare Monitor 102 is distinct from the Oscillatory-Failure Monitor 101, the two monitors 101, 102 are associable. The functions of the tests 11, 13, 14, 17 and the steps 12e, 21, are shared by the Oscillatory-Failure Monitor 101 and the Sustained-Miscompare Monitor 102. The function of the Sustained-Miscompare Monitor 102 may be deleted by eliminating the steps 12a, 18, 19 and the test 20 in a straightforward manner. Unique to the Oscillatory-Failure Monitor are the steps 12b, 12c, 12d, 15, 22, 23, 24, 25, 27, 30, 32 and the tests 26, 28, 29 and 31.

If the Miscompare-Counter has not incremented to its threshold, the Oscillatory-Failure Monitor 101 becomes effective. At a step 24, the Compare Counter is reset to its initial value of MINUS TEN (COMPCT=−10). As discussed hereinafter, the Compare Counter will increment at a step 25 on each pass that the signals (A, B) compare, as determined in the test 17. The function of the step 24 is to reset the Compare Counter whenever the sensor outputs miscompare on a pass.

Next, in a test 26, it is determined whether the signals compared on the previous pass (COMFLG. EQ. PREV COMFLG). This is done by comparing the Comparison Flag, which is set at the step 23 to MINUS ONE, with the Previous Comparison Flag, which is initialized at the step 12d to ZERO, and updated on each pass at the step 22. As determined on each pass, at the step 22, the value of the Previous Comparison Flag will either be ZERO, indicating a previous compare (or initial compare as set in the step 12d), or MINUS ONE, indicating a previous miscompare. In the test 26, if the value of the Comparison Flag (MINUS ONE, as set in the step 23) is not equal to the value of the Previous Comparison Flag (ZERO), the signals compared (agreed) on the previous pass and, at a step 27, the Oscillation Counter is incremented by ONE (OSCCT=OSCCT+1). If the signals did not compare on the previous pass, the value of the Previous Comparison Flag and the Comparison Flag will both equal MINUS ONE at the test 26, and the routine proceeds to the step 22 (discussed hereinbefore). Thus, the Oscillation Counter will only be incremented at the step 27 for each discrete occurrence of a miscompare (i.e., change from compare to miscompare). A miscompare following a sustained compare increments the Oscillation Counter by ONE, but a miscompare following a miscompare will not increment the Oscillation Counter. (This is shown in more detail in FIG. 2). From the step 22 the routine exits at an exit port 16.

If the Oscillation Counter is incremented, at the step 27, based on the signals outputs having compared on the previous pass, it is determined in a test 28, whether the Oscillation Counter has reached its threshold (OSCCT. EQ. 0). If the Oscillation Counter has reached its threshold, a sensor failure will be indicated at the step 21 and the routine is exited via the step 22. If the Oscillation Counter has not reached its threshold, the routine proceeds directly to the step 22. An oscillatory-failure is indicated only when at least five changes from compare to miscompare have occurred. More than five changes from compare to miscompare may be required to increment the Oscillation Counter to its threshold due to counter decrements which occur at a step 32 (discussed hereinafter). Five changes from compare to miscompare requires at least nine passes, since the system is initialized to "compare" at the step 15. More than nine passes may be required to increment the Oscillation Counter to its threshold since "compares" do not increment the Oscillation Counter and a succession of miscompares will only increment the Oscillation Counter once (for the initial miscompare).

If the signals compare, as determined in the test 17, the Miscompare Counter is reset at the step 18. This resets the Sustained-Miscompare Monitor 102. The routine then follows the compare branch 103. First, at the step 25, the Compare Counter is incremented by ONE (COMPCT=COMPCT+1), to keep track of successive compares. Next, in a test 29, it is determined whether the Compare Counter has reached its threshold (COMPCT. EQ. 0). If it has not, the routine proceeds to the step 22. The only way for the Compare Counter to reach its threshold is for the sensor outputs to compare at the step 17 for ten consecutive passes, since any miscompare will reset the Compare Counter to MINUS TEN at the step 24 (discussed hereinbefore). When the Compare Counter reaches its threshold, it is desirable to decrement the Oscillation Counter, but not below its initial value. The Oscillation Counter is decremented, rather than reset, because it is not ipso facto desirable to reset the Oscillatory-Failure Monitor 101, based on a sustained compare. Also, the Compare Counter itself is reset in preparation for another possible decrement of the Oscillation Counter, should the signals (A, B) compare for another ten consecutive passes. Therefore, at a step 30, the Compare Counter is reset (COMPCT=−10) and in a test 31 it is determined whether the Oscillation Counter is at its reset value. If so, it is not decremented and the routine proceeds to the step 22 (discussed hereinbefore). If the Oscillation Counter is not at its reset value (i.e., it is incremented between MINUS FOUR AND MINUS ONE) it is decremented at a step 32 (OSCCT=OSCCT −1) and the routine proceeds to the step 22 (discussed hereinbefore).

An important feature of this invention is the relationship between the Compare Counter and the Oscillation Counter. As the Oscillation Counter increments, based on discrete miscompares, the amount of time (duty cycles) required for a sustained compare to fully decrement the Oscillation Counter also increases. For improved failure coverage it is important to decrement the Oscillation Counter successively, rather than to reset it based on a discrete condition. Another important feature of this invention is that the Oscillation Counter is never decremented below its initial value. This prevents a negative bias from accumulating as a result of a compare, sustained longer than is necessary (if at all) to fully decrement the Oscillation Counter to its initial value.

The digital routine as herein described has been successfully implemented using the various thresholds and initial values as specified herein, with a duty cycle of 80 hz. The Sustained-Miscompare Monitor 102 will therefore time-out (i.e., count five successive miscompares) when a miscompare has lasted for 5/80 seconds. The Oscillatory-Failure Monitor 101 requires at least nine passes (i.e., 9/80 seconds), alternating from compare to miscompare to declare a sensor failure. An analysis of the particular oscillation frequencies and modes to be detected, dictates the choice of thresholds, decrements, initial values, duty cycle. Since helicopter AFCS automatic control outputs are limited in bandwidth, oscillations above certain frequencies will be attenuated. Also, the airframe will not respond to oscillations above certain frequencies. It is especially important to select a duty cycle for the routine which is sufficiently larger than the highest undesirable oscillation frequency, lest oscillations go undetected due to a fortuitous time relationship between the test 17 and miscompare nulls (discussed hereinafter in further detail).

It should be understood that the thresholds, decrements, initial values, and duty cycle may be tailored to a number of individual applications and that the Oscillatory-Failure Monitor 101 may be utilized alone, or with a failure monitor other than the Sustained-Miscompare Monitor 102. It should also be understood that the Oscillatory-Failure Monitor 101 of this invention may be practiced in any system where it is useful to compare a plurality of signals and count the number of discrete miscompares (e.g., occurrence of a singular disparity), decrementing the Oscillation Counter as a result of a sustained compare. The signals (A, B) may be provided by any number of means, and may be indicative of a variety of conditions. Furthermore, the signals (A, B) may be compared as to amplitude, phase, frequency, or any suitable paramater.

Figure 2:
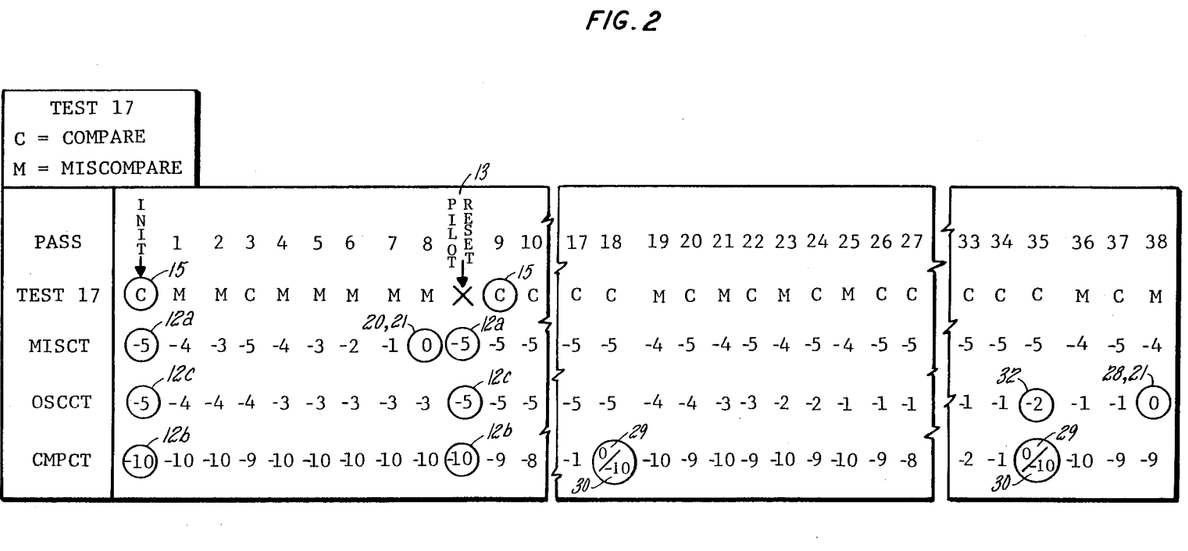
FIG. 2 is a truth table that relates to the flow diagram of FIG. 1.

In FIG. 2 is shown the values of the various counters on successive passes of the routine of FIG. 1, relative to the results of the test 17. In the initialization process (INIT) the Miscompare Counter (MISCT) is set to MINUS FIVE (12a), the Oscillation Counter (OSCCT) is set to MINUS FIVE (12c) and the Compare Counter (CMPCT) is set to MINUS TEN (12b). An initial compare condition is set (15).

Turning now to the first pass, the signals (A, B) miscompare (M). Therefore, the Miscompare Counter is incremented (the step 19 of FIG. 1) to MINUS FOUR and the Oscillation Counter is also incremented (the step 27 of FIG. 1) to MINUS FOUR since the signals have gone from compare (initialized) to miscompare (M). The Compare Counter is not incremented on the first pass since the signals do not compare.

On the second pass the signals miscompare (M). Therefore, the Miscompare Counter is incremented to MINUS THREE. However, the Oscillation Counter is not incremented since the signals have remained at miscompare for the first and second passes. Only a discrete miscompare (i.e., change from compare to miscompare) will increment the Oscillation Counter. Again, the Compare Counter will not increment.

On the third pass the signals compare (C). Therefore, the Miscompare Counter is reset (the step 18 of FIG. 1) to its initial value of MINUS FIVE. The Oscillation Counter remains at its value of MINUS FOUR since a change from miscompare to compare causes it neither to increment nor to decrement. On this pass, however, the Compare Counter is incremented (the step 25 of FIG. 1) to MINUS NINE since the signals compare.

On the fourth pass the signals miscompare (M). Therefore, the Miscompare Counter is incremented to MINUS FOUR. The Oscillation Counter is further incremented, to MINUS THREE, since the signals have gone from compare to miscompare. The Compare Counter is reset (the step 24 of FIG. 1) to its initial value of MINUS TEN since the signals miscompare.

On the fifth pass the signals miscompare (M). Therefore, the Miscompare Counter is further incremented to MINUS THREE. The Oscillation Counter remains at a value of MINUS THREE and the Compare Counter remains at a value of MINUS TEN since the miscompare is sustained from the fourth to fifth pass.

On the sixth pass the signals miscompare (M). Therefore, the Miscompare Counter is further incremented to MINUS TWO. The Oscillation Counter remains at MINUS THREE and the Compare Counter remains at MINUS TEN.

On the seventh pass the signals miscompare (M). Therefore, the Miscompare Counter is further incremented to MINUS ONE. The Oscillation Counter remains at MINUS THREE and the Compare Counter remains at MINUS TEN.

On the eighth pass the signals miscompare (M). Therefore, the Miscompare Counter is incremented to its threshold, ZERO (20). This is a Sustained-Miscompare Failure. The signals have miscompared for five successive passes. The Oscillation Counter and the Compare Counter remain at values established in the seventh pass.

A failure having been indicated (21), the pilot exercises his option to reset the system (13). Therefore, the Miscompare Counter is reset to a value of MINUS FIVE (12a), the Oscillation Counter is reset to a value of MINUS FIVE (12a), the Oscillation Counter is reset to a value of MINUS FIVE (12c), and the Compare Counter is reset to a value of MINUS TEN (12b). The pilot reset (13) also establishes the initial compare condition (15) for the ninth pass.

On the ninth pass begins a succession of signal compares that lasts until the eighteenth pass. Therefore, both the Miscompare Counter and the Oscillation Counter remain at their values as established prior to the ninth pass, herein established by the Pilot Reset (13). On each successive pass that the signals compare, beginning with the ninth pass, the Compare Counter is incremented by one. On the seventeenth pass the Compare Counter is incremented by one to MINUS ONE. On the eighteenth pass the signals compare (C) and the Compare Counter reaches its threshold, ZERO (the step 29 of FIG. 1). This causes the Compare Counter to reset to its initial value of MINUS TEN (the step 30 of FIG. 1). Although the Compare Counter reaches its threshold the Oscillation Counter will not be decremented because it is at its initial value of MINUS FIVE (the step 31 of FIG. 1).

On the nineteenth pass the signals miscompare (M). Therefore, the Miscompare Counter is incremented to MINUS FOUR and the Oscillation Counter is incremented to MINUS FOUR. The Compare Counter remains at its reset value of MINUS TEN.

On the twentieth pass the signals compare (C). Therefore, the Miscompare Counter is reset. The Oscillation Counter remains at its previous value, and the Compare Counter is incremented.

On the twenty-first pass the signals miscompare (M). Therefore, the Miscompare Counter is incremented, the Oscillation Counter is incremented, and the Compare Counter is reset.

On the twenty-second pass the signals compare (C). Therefore, the Miscompare Counter is reset, the Oscillation Counter remains at its previous value, and the Compare Counter is incremented.

On the twenty-third pass the signals miscompare (M). Therefore, the Miscompare Counter is incremented, the Oscillation Counter is incremented, and the Compare Counter is reset.

On the twenty-fourth pass the signals compare (C). Therefore, the Miscompare Counter is reset, the Oscillation Counter remains at its previous value, and the Compare Counter is incremented.

On the twenty-fifth pass the signals miscompare (M). Therefore, the Miscompare Counter is incremented, THE Oscillation Counter is incremented, and the Compare Counter is reset.

On the twenty-sixth pass begins a succession of signal compares that lasts until the thirty-fifth pass. Therefore, the Miscompare Counter is reset and remains at MINUS FIVE. The Oscillation Counter remains at MINUS ONE through the thirty-fourth pass. As the compare is sustained, the Compare Counter increments until it reaches a threshold value of ZERO (29) in the thirty-fifth pass. This causes the Oscillation Counter to decrement by one (32) to a value of MINUS TWO. Also the Compare Counter will reset itself (30).

On the thirty-sixth pass the signals miscompare (M). Therefore, the Miscompare Counter is incremented, the Oscillation Counter is incremented, and the Compare Counter remains at its reset value.

On the thirty-seventh pass the signals compare (C). Therefore, the Miscompare Counter is reset, the Oscillation Counter remains at its previous value, and the Compare Counter is incremented.

On the thirty-eighth pass the signals miscompare (M). Therefore, the Miscompare Counter is incremented. The Oscillation Counter is incremented to its threshold, ZERO (28). This is an Oscillatory-Failure (21).

The routine described herein is straightforward and capable of implementation in even the simplest of digital computers of a variety of architectural types, employing well known programming techniques or in a dedicated digital device.

Figure 3:
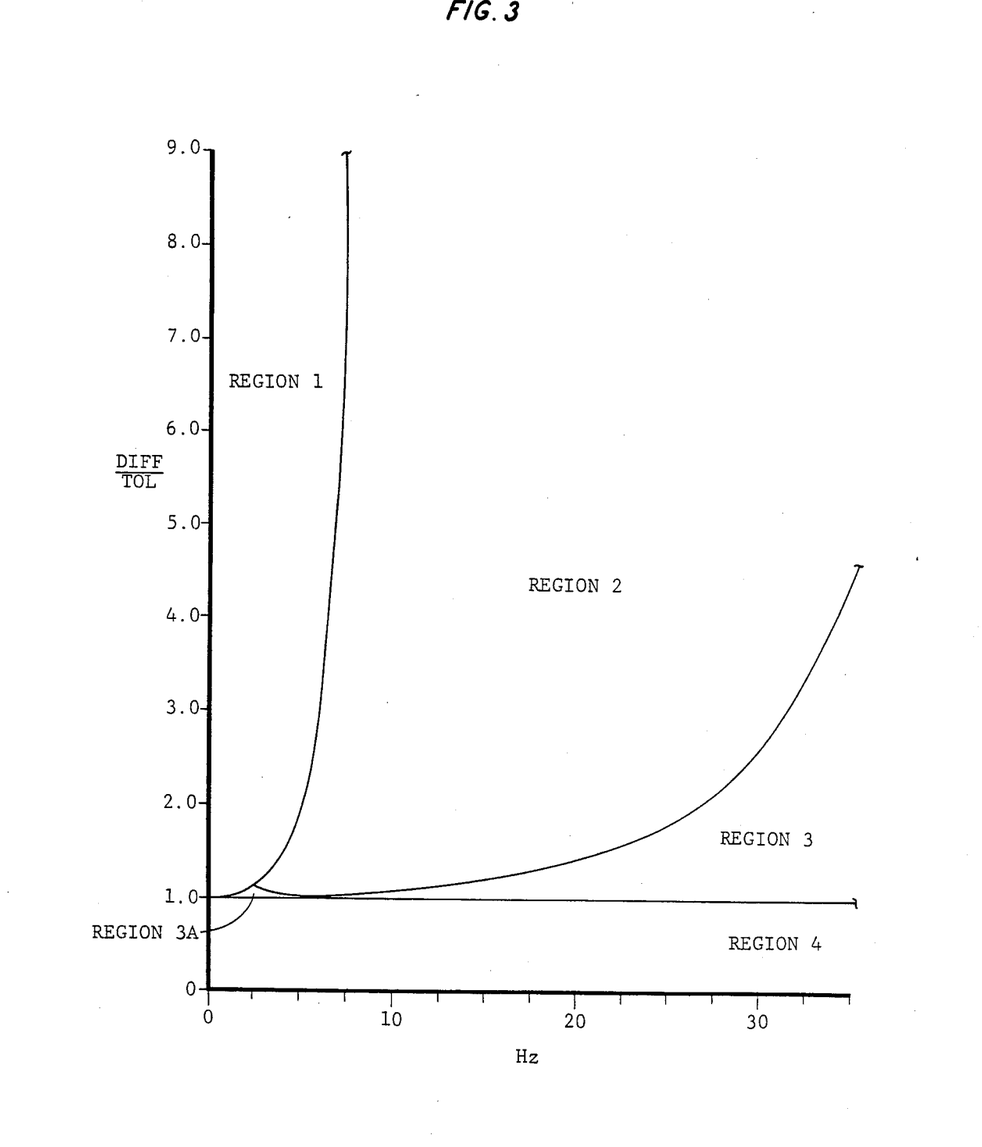
FIG. 3 is a comparison of miscompare modes that will be detected by the monitors disclosed in FIG. 1.

In FIG. 3 is shown a graph of sensor miscompares that will be detected by the Sustained-Miscompare Monitor 102 and the Oscillatory-Failure Monitor 101. The horizontal axis represents oscillation frequency, in other words, the frequency at which the sensor outputs vary from compare-to-miscompare-to-compare, etc. For purposes of this graph, signal (A, B) amplitudes are compared, for agreement within a tolerance (TOL). The vertical axis represents a ratio of disparity of signal amplitudes (DIFF) to the tolerance (TOL). In a Region 4, the disparity (DIFF) is less than or equal to the tolerance (TOL). Therefore, no miscompare is detected, either by the Sustained-Miscompare Monitor 102 or by the Oscillatory-Failure Monitor 101.

Region 1 shows failures that are detected by the Sustained-Miscompare Monitor 102. A failure is indicated when the time during which there is disparity among the signals (A, B) lasts for a confirmed-failure time interval. If the signal disparity is not oscillatory (OHz), such as in a hard-over or go-dead, all miscompares where the disparity (DIFF) exceeds the tolerance (TOL) will be detected. However, for oscillatory miscompares, at a given frequency, the time during which the sensor outputs miscompare is proportional to the amplitude of the miscompare, since the miscompare tolerance is non-zero. This accounts for the curve that defines Region 1. The upper frequency limit of Region 1 is the reciprocal of the confirmed-failure time interval that is selected as an indication of a Sustained Miscompare.

Region 2 shows failures that are detected by the Oscillatory-Failure Monitor 101, but not by the Sustained-Miscompare Monitor 102. At very low frequencies, for low amplitude oscillations, the time during which the signals compare may exceed the sustained-compare time interval and decrement the Oscillation Counter. This accounts for a small region (Region 3A) of non-coverage, the size of which can be controlled by judicious selection of sustained-compare time interval. As the frequency of the oscillatory miscompare increases, some transitions from compare to miscompare will not be sensed by the Oscillatory-Failure Monitor 101. This is because the sensor outputs are compared (sampled) at a discrete moment in time (the test 17 of FIG. 1) and the oscillatory miscompare may be out of phase with the sampling cycle. As the frequency of oscillations increases and approaches the program duty cycle, this effect is more pronounced. Therefore, the upper limit of Region 2 is analytically defined, based on the duty cycle.

Region 3 indicates oscillatory failures that will not be detected by the Oscillatory-Failure Monitor 101. In a real-world application of the Oscillatory-Failure Monitor 101, such as in AFCS, the sensor outputs in Region 3 may not be of concern. This is especially true when the sensor outputs are lagged, as in an AFCS, or when the oscillation frequency is beyond the frequency response of the aircraft. Therefore, it is important to choose a duty cycle that will establish the boundary between Region 2 and Region 3 in an effective manner.

Figure 4:
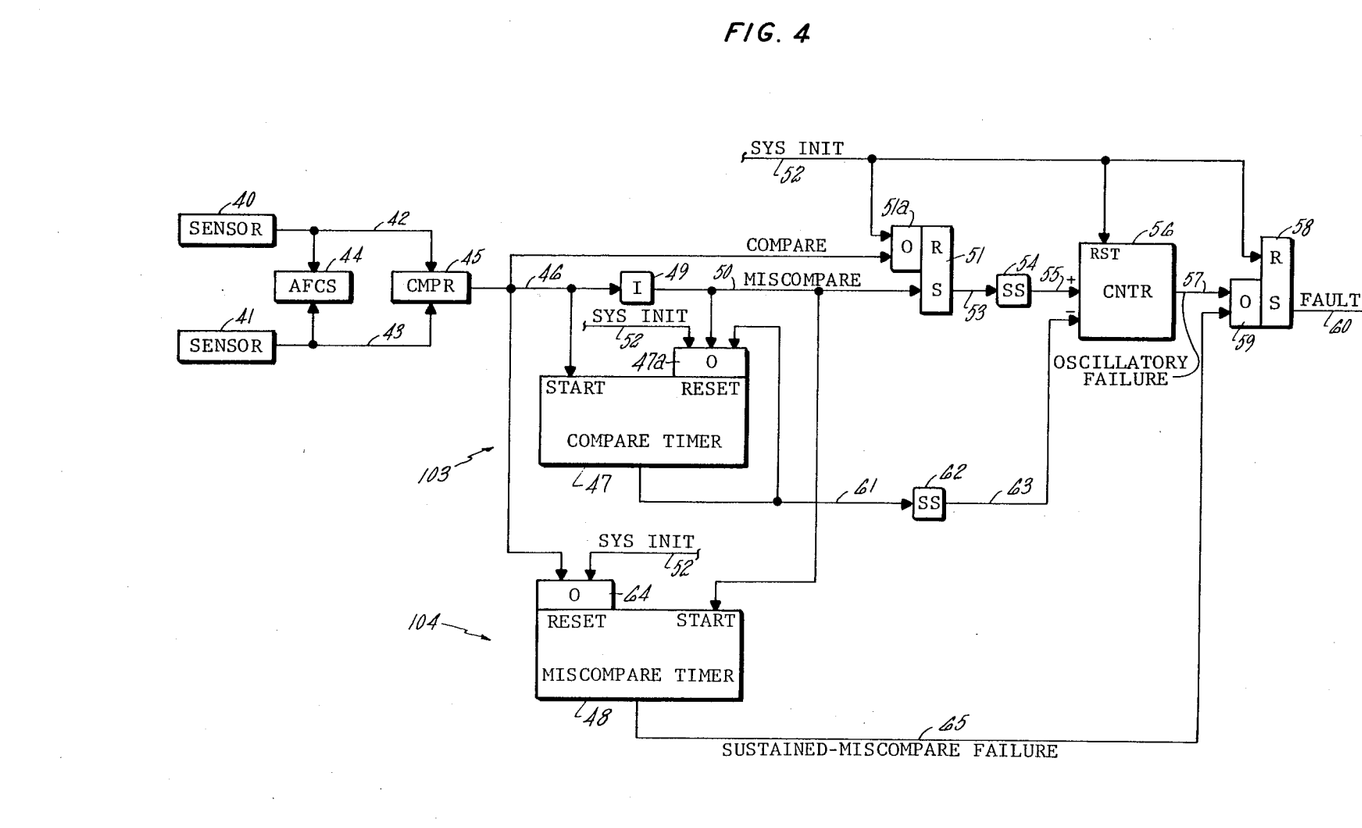
FIG. 4 is a simplified block diagram of a dedicated hardware embodiment of the Oscillatory-Failure Monitor in association with a SustainedMiscompare Monitor.

In FIG. 4 is shown a dedicated hardware embodiment of an Oscillatory-Failure Monitor 103 in association with a Sustained-Miscompare Monitor 104. Redundant sensors 40, 41 provide signals on a line 42 and a line 43, respectively, in response to a single physical condition. These sensor signals are used to control a system, such as an AFCS 44.

The sensor signals on the lines 42, 43 are compared to each other by a comparator 45. When the sensor signals compare (i.e., agree within a tolerance of each other), a signal is provided on the line 46 by the comparator 45. When the sensor signals miscompare (i.e., disparity) no signal is provided on the line 46. The signal on the line 46 starts a compare timer 47 and resets a miscompare timer 48, through an OR circuit 64. The function of the Miscompare Time 48 is discussed hereinafter. When there is no signal on the line 46, the inverter 49 provides a signal on a line 50 to set a bistable device 51. When the sensor signals compare, the signal on line 46 resets the bistable device 51 through an OR circuit 51a. A reset signal (SYS INIT) on a line 52 also resets the bistable device 51, through the OR circuit 51a, to establish an initial compare condition when the Oscillatory-Failure Monitor 103 is turned on or reset. Therefore, whenever the sensor signals miscompare, the bistable device 51 will set. And, each time the sensor signals compare, the bistable device 51 will reset. This provides an increment signal on a line 53 for each discrete miscompare (i.e., transition from compare to miscompare). The increment signal remains so long as the sensor signals miscompare. A single-shot 54 responds to the increment signal and provides a measured pulse (increment) on a line 55 each time the set-reset device 51 sets. Each measured pulse (increment) on the line 55 represents a transition from compare to miscompare.

An up/down counter 56 is initialized by the reset signal (SYS INIT) on the line 52. The counter 56 increments each time the single-shot 54 provides the measured pulse (increment). Therefore, through the cooperative action of the comparator 45, the inverter 49, the bistable device 51, and the single-shot 54, the counter 56 is incremented each time the sensor signals vary from compare to miscompare. The counter 56 may be any device known in the art that is capable of incrementing to a threshold and generating an output when so incremented, such as an integrator and a comparator. The counter 56 provides an oscillatory-failure signal on a line 57 when incremented to a threshold. The oscillatory-failure signal will, through an OR circuit 59, set a bistable device 58. The bistable device 58 is initially reset by the reset signal (SYS INIT) on the line 52 and, in its set state, indicates a sensor failure by an output on a line 60 (FAULT).

The compare timer 47 is reset by the reset signal on the line 52 through an OR circuit 47a and starts running whenever the sensor signals compare (i.e. signal present on the line 46). Whenever the sensor signals miscompare, the signal on the line 50 resets the compare timer 47 through the OR circuit 47a. The compare timer 47 times-out when a compare is sustained for a predetermined-time interval, thereby providing a decrement signal on a line 61. A single-shot 62 provides a measured pulse (decrement) on a line 63 in response to the decrement signal on the line 61. The measured pulse (decrement) decrements the counter 56 since it is connected to the counter 56 in an opposite sense to the measure pulse (increment) on the line 55. Therefore, the counter 56 will decrement each time the compare timer 47 "times-out". The counter 56 does not decrement below its initial value so as not to bias the system in response to sustained compares that last longer than is required to decrement the counter 56 to its initial value. Also, whenever the compare timer 47 times-out, it resets itself by the decrement signal on the line 61 through the OR circuit 47a.

The Oscillatory-Failure Monitor 103 comprises the comparator 45, the inverter 49, the bistable device 51, the single-shot 54, the counter 56, the compare timer 47, and the single-shot 62. An Oscillatory-Failure signal on the line 57 will indicate when a predetermined number of changes (oscillations) from compare-to-miscompare have occurred, taking into account offsets for sensor signal compares that last for a predetermined-time interval, as determined by the compare timer 47, and cause decrements of the counter 56. The Oscillatory-Failure Monitor 103 may operate in conjunction with Sustained-Miscompare Monitor 104, as shown, so that the system as a whole is able to monitor a wider range of sensor failures. The comparator 45 is a common element to both the Oscillatory-Failure Monitor 103 and the Sustained-Miscompare Monitor 104.

A miscompare timer 48 starts timing when the signals miscompare, as indicated by the signal on the line 50. The miscompare timer 48 is initially reset by the reset signal (SYS INIT) on the line 52, through an OR circuit 64. The miscompare timer 48 is also reset when the signals compare, as indicated by the signal on the line 46, through the OR circuit 64. The miscompare timer 48 times-out when the sensor signals miscompare for a confirmed-failure time interval. When the miscompare timer 48 times-out, a signal is provided on a line 65. The signal on the line 65 sets the bistable device 58 through the OR circuit 59 to indicate a sustained-miscompare failure. The presence of either the signal on the line 65 or the signal on the line 57 will cause the OR circuit 59 to set the bistable device 58, thereby indicating a sensor failure (FAULT).

The foregoing description is in simplified block form. Many of the foregoing functions can obviously be achieved in a simpler fashion by using more true and complement outputs and fewer inverters; in many instances the positive logic disclosed may readily be reworked into inverting logic to be more suitably applicable to available hardware chips. The description is, therefore, principally in terms of function achieving blocks, and it should be understood that numerous variations may be utilized for achieving the same or equivalent functions and combinations of functions within the skill of the art.

Figure 5:
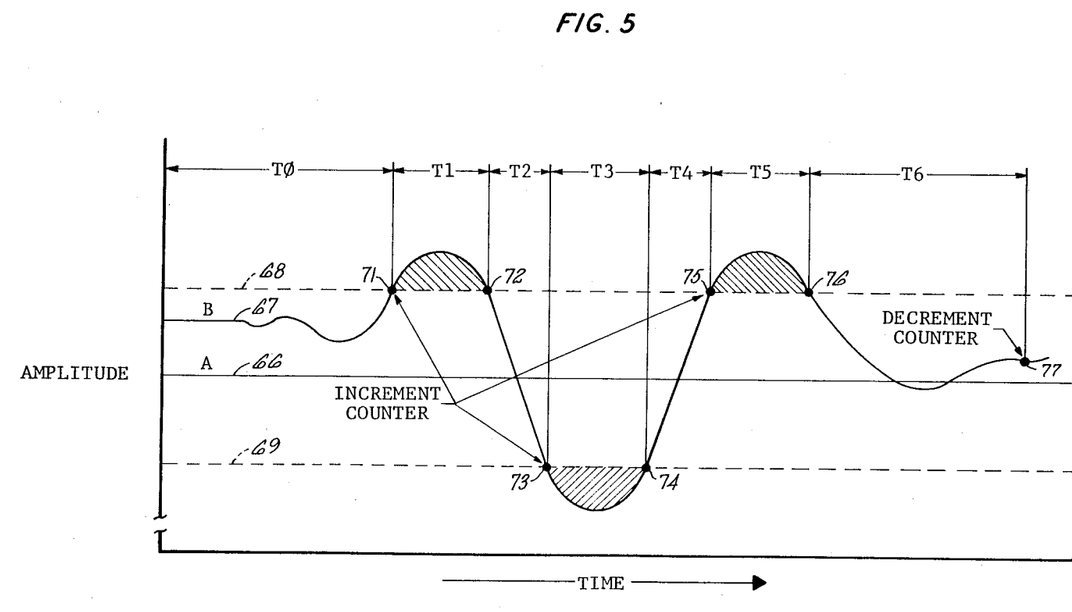
FIG. 5 is a graph of two redundant sensor outputs, such as those of FIG. 4.

In FIG. 5 is shown two sensor signals (A, B) as they oscillate (vary) from compare-to-miscompare-to-compare, etc. The signal (A) on a line 66 is shown as constant, for simplicity, and the signal (B) on a line 67 is shown varying in amplitude. Signal amplitude is represented on the vertical axis, both signals positive, and time is represented on the horizontal axis. An upper miscompare tolerance limit is indicated by a broken line 68 and lower miscompare tolerance limit is indicated by a broken line 69. Various time intervals along the horizontal axis are designated, T0 through T6, and various moments in time are designated, 71 through 77. When the signal B, on the line 67, is within the miscompare tolerance limits 68, 69, the signals "compare." When the signal B, on the line 67 is not within the miscompare tolerance limits 68, 69, the signals "miscompare."

During the interval T0, the signal B fluctuates above the signal A. However, the signal B, on the line 67, is within the upper miscompare tolerance limit 68. As the signal B increases above the upper miscompare tolerance limit 68, the Oscillatory-Failure Counter will increment at a point 71 since the signals vary from compare-to-miscompare. During the interval T1 the signal B remains above the upper miscompare tolerance limit 68 and the Oscillatory-Failure Counter is not incremented.

As the signal B decreases below the upper miscompare tolerance limit 68, the Oscillatory-Failure Counter will not increment at a point 72, since the signals vary from miscompare-to-compare. During the interval T2 the signal varies from greater to less than the amplitude of signal A. But, since the signal B is within the miscompare tolerance limits 68, 69 during the interval T2 (i.e., compare), the Oscillatory-Failure Counter does not increment.

As the signal B decreases below the lower miscompare tolerance limit 69, the Oscillatory-Failure Counter will increment at a point 73 since the signals vary from compare-to-miscompare. During the interval T3 the signal B remains below the lower miscompare tolerance limit 69 and the Oscillatory-Failure Counter is not incremented.

As the signal B increases above the lower miscompare tolerance limit 69 the Oscillatory-Failure Counter does not increment at a point 74, since the signals vary from miscompare-to-compare. During the interval T4 the signal B varies from less to greater than the signal A. But, since the signal B is within the miscompare tolerance limits 68, 69 during the interval T4 (i.e., compare) the Oscillatory-Failure Counter will not increment.

As the signal B increases above the upper miscompare limit 68, the Oscillatory-Failure Counter will increment at a point 75 since the signals vary from compare-to-miscompare. During the interval T5 the signal B remains above the upper miscompare tolerance limit 68 and the Oscillatory-Failure Counter is not incremented.

When the Oscillatory-Failure Counter is incremented five times, from its initial value, an oscillatory-failure will be declared, except as follows: As the signal B decreases below the upper miscompare tolerance limit 68, the Oscillatory-Failure Counter does not increment at a point 76, since the signals vary from miscompare-to-compare. During the interval T6 the signal B fluctuates with respect to the signal A, but remains within the miscompare tolerance limits 68, 69. In other words, during the interval T6, the signals compare. When the signals compare for a predetermined time interval (herein, the interval T6) the Oscillatory-Failure Counter will be decremented at a point 77. The compare times during the intervals T2 and T4 are not of sufficient duration to decrement the Oscillatory-Failure Counter.

Although the invention has been shown and described with respect to exemplary embodiments thereof, it should be understood that various changes, omissions and additions in the form and detail thereof may be made therein and thereto, without departing from the spirit and the scope of the invention.

What is claimed is:

1. An oscillatory-failure monitor that comprises:

means (40, 41) for providing a plurality of signals, comparator means (45) for providing a compare signal (46) when a parameter of each signal of the plurality of signals is in agreement, within a tolerance, with the parameter of each of the other signals of the plurality of signals, in response to the plurality of signals;

timer means (47) for providing a decrement signal in response to the sustained provision of the compare signal for a threshold interval of time;

means (45, 49) for providing a discrete miscompare signal (55) upon each discrete occurance of at least a single disparity, without the tolerance, among the signal parameters, in response to the plurality of signals;

counter means (56) for providing a count signal that increments in value in response to each discrete miscompare signal and that decrements in value in response to each provision of the decrement signal;

means (58) for providing a fault indication in response to the count signal having incremented to a threshold value.

* * * * *